(12) United States Patent
Batruni

(10) Patent No.: US 7,688,235 B2
(45) Date of Patent: Mar. 30, 2010

(54) COMPOSITE ANALOG TO DIGITAL RECEIVER WITH ADAPTIVE SELF-LINEARIZATION

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 179 days.

(21) Appl. No.: 11/904,614

(22) Filed: Sep. 27, 2007

(65) Prior Publication Data

US 2008/0291066 A1 Nov. 27, 2008

Related U.S. Application Data

(60) Provisional application No. 60/848,089, filed on Sep. 29, 2006, provisional application No. 60/848,425, filed on Sep. 29, 2006, provisional application No. 60/848,088, filed on Sep. 29, 2006.

(51) Int. Cl.
 *H03M 1/12* (2006.01)
(52) U.S. Cl. .................................... 341/118; 341/155
(58) Field of Classification Search .................. 341/118, 341/120, 141, 155; 702/86
 See application file for complete search history.

(56) References Cited

U.S. PATENT DOCUMENTS

| 4,763,108 | A | | 8/1988 | Kobayashi | |
|---|---|---|---|---|---|
| 5,239,299 | A | * | 8/1993 | Apple et al. | 341/118 |
| 5,294,926 | A | | 3/1994 | Corcoran | |
| 6,081,215 | A | | 6/2000 | Kost et al. | |
| 6,522,282 | B1 | * | 2/2003 | Elbornsson | 341/155 |
| 6,819,279 | B2 | * | 11/2004 | Pupalaikis | 341/155 |
| 7,253,762 | B2 | * | 8/2007 | Huang et al. | 341/155 |
| 7,336,729 | B2 | * | 2/2008 | Agazzi | 341/118 |
| 7,386,409 | B2 | * | 6/2008 | Mueller et al. | 702/106 |
| 2007/0205934 | A1 | * | 9/2007 | Buisson | 341/155 |
| 2007/0244669 | A1 | * | 10/2007 | Vogel et al. | 702/190 |

OTHER PUBLICATIONS

Elbornsson et al., Blind Adaptive Equalization of Mismatch Errors in a Time-Interleaved A/D Converter System, IEEE Transactions on Circuits and Systems—I: Regular Papers, vol. 51, No. 1, Jan. 2004, pp. 151-158.*

* cited by examiner

*Primary Examiner*—Howard Williams
(74) *Attorney, Agent, or Firm*—Van Pelt, Yi & James LLP

(57) ABSTRACT

A distortion correcting analog to digital converter (ADC) system includes a plurality of ADCs configured to convert an analog signal to a plurality of digital ADC outputs, wherein the plurality of ADCs are configured to generate a composite signal based on the plurality of ADC outputs, there is an offset between a first one of the plurality of ADC outputs and a second one of the plurality of ADC outputs, the offset causing distortion in the composite signal. The system further includes an adaptive self-linearizer configured to receive the composite signal, and to perform self-linearization based on the composite signal to correct for the distortion in the composite signal.

Generating a distortion corrected digital signal includes converting an analog signal to a plurality of digital signals; generating a composite signal based on the plurality of digital signals; wherein there is an offset between a first one of the plurality of ADC outputs and a second one of the plurality of ADC outputs, the offset causing distortion in the composite signal. The method further includes sending the composite signal to an adaptive self-linearizer and performing self-linearization based on the composite signal to correct for distortion in the composite signal.

20 Claims, 15 Drawing Sheets

COMPOSITE ANALOG TO DIGITAL RECEIVER WITH ADAPTIVE SELF-LINEARIZATION

CROSS REFERENCE TO OTHER APPLICATIONS

This application claims priority to U.S. Provisional Patent Application No. 60/848,089 entitled ADAPTIVE SELF-LINEARIZATION: LOW-POWER AND LOW-COMPLEXITY SYSTEM OPERATION AND ARCHITECTURE filed Sep. 29, 2006, U.S. Provisional Patent Application No. 60/848,425 entitled ADAPTIVE SELF-LINEARIZATION: FULL SYSTEM OPERATION AND ARCHITECTURE filed Sep. 29, 2006, and U.S. Provisional Patent Application No. 60/848,088 entitled INTERLEAVE DISTORTION filed Sep. 29, 2006, which are incorporated herein by reference for all purposes.

BACKGROUND OF THE INVENTION

A composite analog to digital converter (ADC or A-to-D) is a device comprising a plurality of ADCs. Each of the ADC components is configured to convert an analog signal to digital. An analog signal is processed by the ADCs, and the outputs of the ADCs are combined to generate a composite digital output signal. The composite ADC can be used in a wide range of applications such as communications and digital imaging. It can achieve high performance at a relatively low cost since the ADC components are often less expensive devices with lower performance.

FIG. 1A illustrates a composite ADC embodiment. In the example shown, composite ADC 100 is arranged in an interleaving configuration. ADCs 1-N each have a sampling rate of $F_s$. The analog input signal y is sampled and selectively switched into the ADCs, via a switch 104, at a sampling rate of $NF_s$. The outputs of the ADCs are selected by a switch 106 and interleaved into an output sequence $y_n$, at a rate of $NF_s$. Thus, interleaving allows a high speed composite ADC to be constructed using a number of lower speed ADCs.

FIG. 1B illustrates another composite ADC embodiment. Composite ADC 150 is in a parallel configuration in this example. ADC components 1-N each have a sampling rate of $F_s$. The input signal y is sent to all the ADCs simultaneously, and the sampled outputs are summed at 152. The combined signal strength is N times the signal strength of one ADC. The resulting noise, however, only increases at ½ the rate of the signal strength increase. Thus, the resulting signal has a higher signal to noise ratio than the individual ADC components.

Although composite ADCs offer performance gains, mismatch in the component ADCs, including mismatch in clock phase, signal path gain, and/or device characteristics often leads to signal distortions. FIGS. 2A-2B are signal diagrams illustrating the effects of the mismatches in example composite ADCs that include two component ADCs. FIG. 2A shows the signal diagrams of an interleaved composite ADC example. The input switched into the ADCs is controlled by a clock that has a duty cycle of approximately 50%. Signals $y_A$ and $y_B$ are outputs of components ADC1 and ADC2, respectively. The sampling point are shown for purposes of illustration and do not necessarily correspond to the actual sampling rate. Ideally, the sampling phases for the two ADCs are at 50% duty cycle. In practice, however, there is a phase offset of □ between the samples of the two ADCs, as well as an amplitude offset. Thus, there is distortion in the composite signal 200 attributed to aliasing in the resulting composite signal $y_n$. The frequency domain diagram shows desired signal 202 and aliased image 204.

Similarly, in FIG. 2B where the signal diagrams of a parallel composite ADC example are shown, there is an offset in the samples of the two ADCs, causing aliasing effects in the output signal $y_n$. In the frequency domain diagram, images 212 and 214 correspond to the desired signal and the aliased image, respectively. The aliased image is undesirable since it may cause interference with adjacent frequency channels. Furthermore, since the frequency location of the aliased image is not necessarily known a priori and may vary over time, it would be difficult to configure a conventional error correction filter to compensate for the distortion.

It would be useful, therefore, to have a technique for correcting output distortions in composite ADCs. It would also be desirable if the technique is flexible enough to compensate for distorted outputs at unknown, varying frequency locations.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Converting an analog signal to digital and correcting for distortion using signal linearization technique is described. As used herein, linearization refers to removing or compensating the nonlinearities in a signal. In some embodiments, based on a received distorted signal with unknown characteristics, self-linearization is performed to compensate for nonlinear distortion and obtain an output signal that is substantially undistorted. As used herein, self-linearization refers to calibration/linearization that does not require a training signal whose specific characteristics (such as frequency components, amplitudes, phases, data sequence, and/or modulation scheme) are already known to the module receiving the signal.

A number of adaptive self-linearization implementations are possible in different embodiments. In the following specification, using an adaptive self-linearization module to correct for distortion in any unknown signal is described in detail. Using an adaptive self-linearization module to correct for distortion in a composite ADC is further described.

Figure 3A:
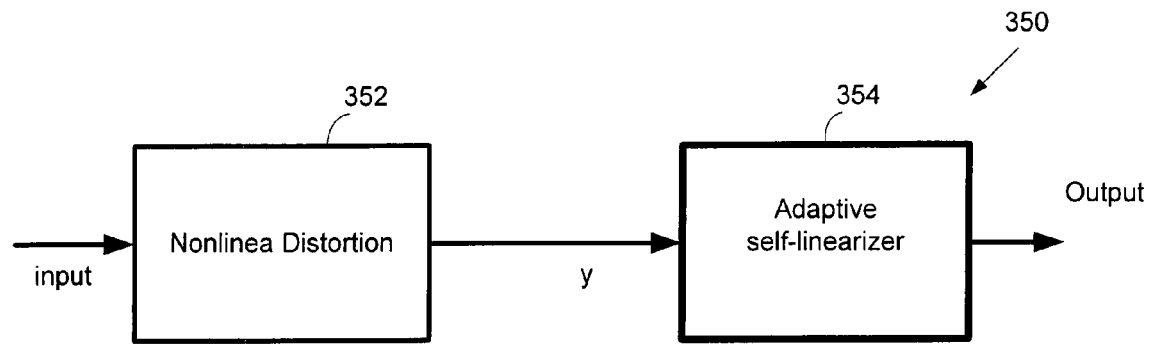
FIG. 3A is a block diagram illustrating an embodiment of a generalized distortion correcting system.

FIG. 3A is a block diagram illustrating an embodiment of a generalized distortion correcting system. An unknown input signal x is distorted by block 352, generating a distorted signal y, which may be either analog or digital. Block 352 represents nonlinear distortion introduced by the transmission media, electronic circuits, or any other source. An adaptive self-linearizer 354 is configured to correct for the distortion based on the received signal y.

Figure 1A:
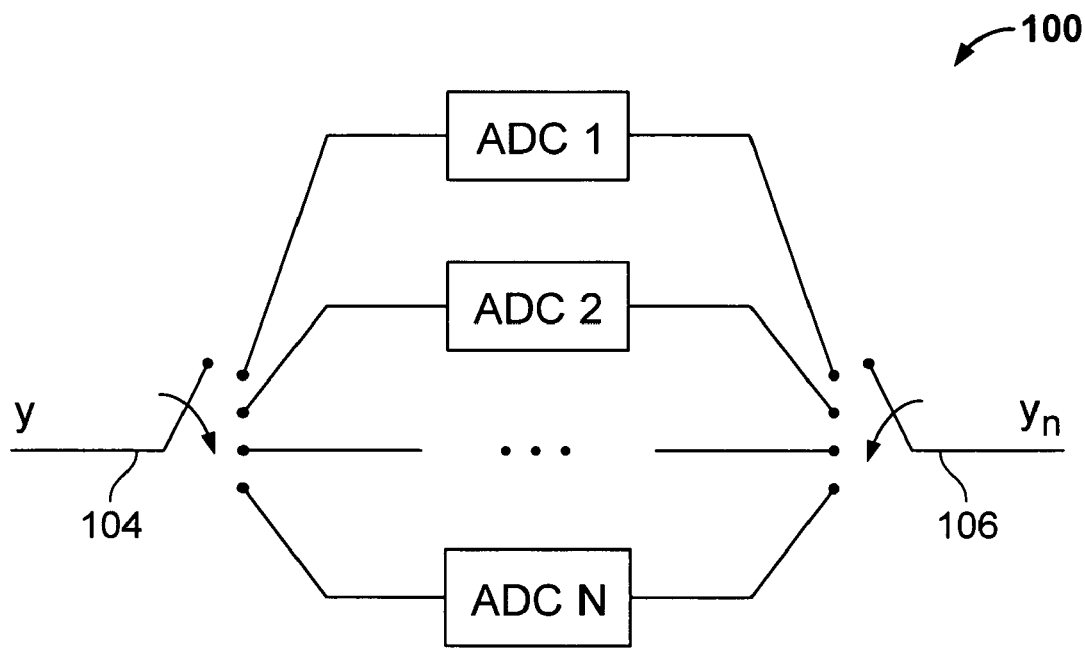
FIGS. 1A-1B illustrate composite ADC embodiments.
Figure 1B:
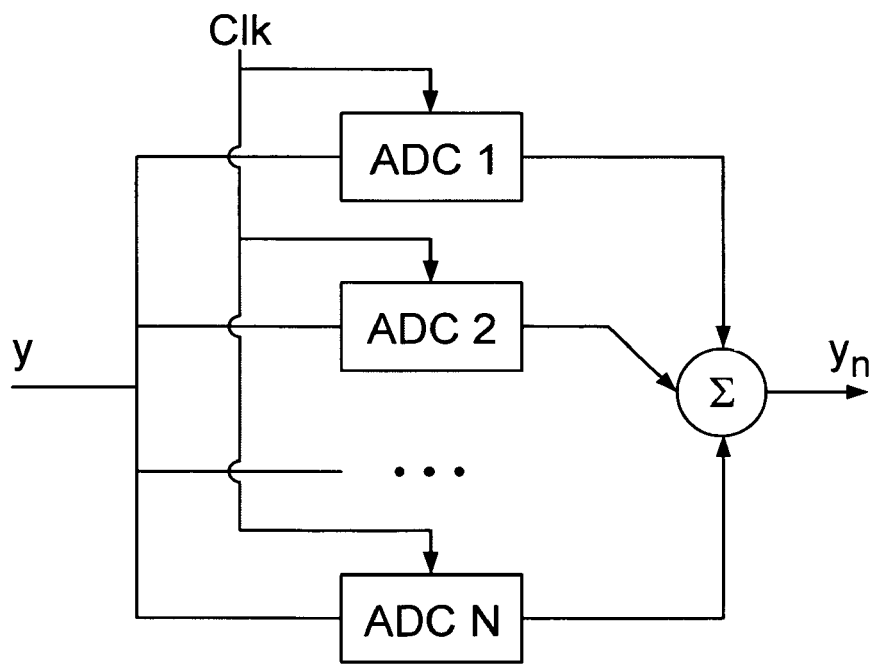
Figure 2A:
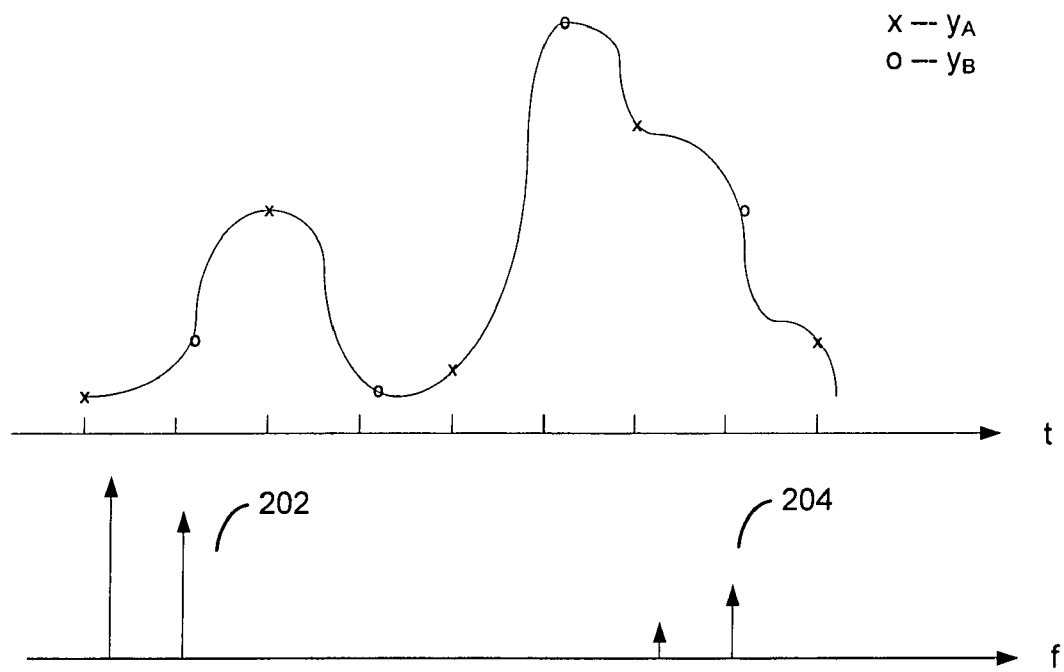
FIGS. 2A-2B are signal diagrams illustrating the effects of the mismatches in example composite ADCs that include two component ADCs.
Figure 2B:
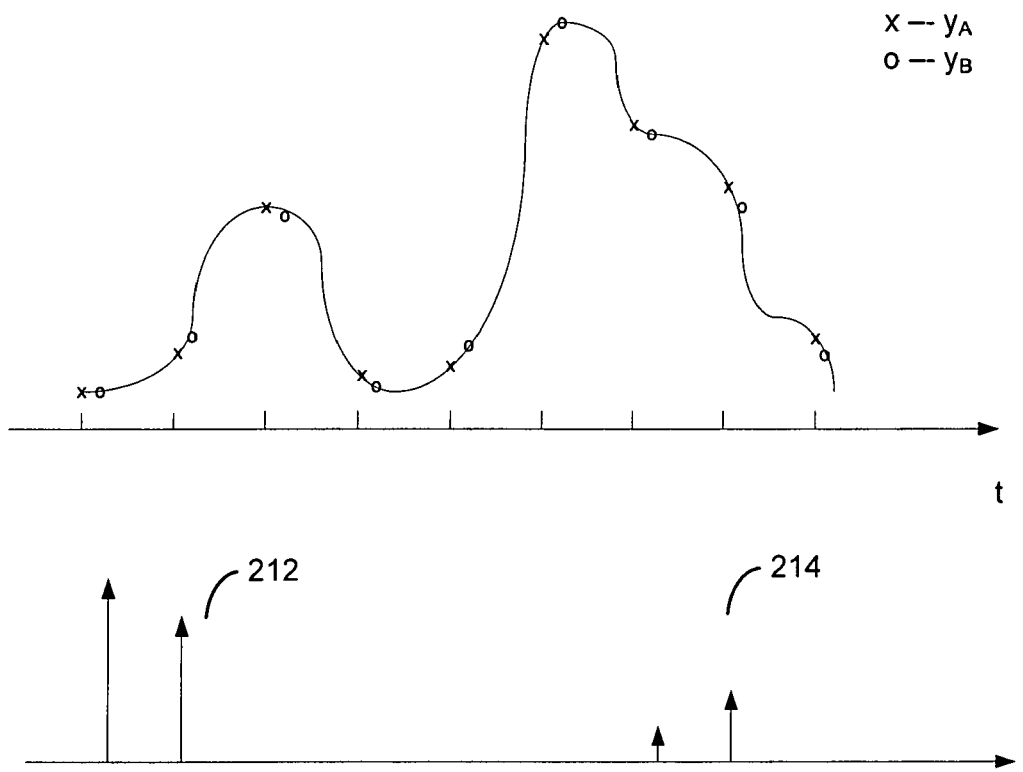
Figure 3B:
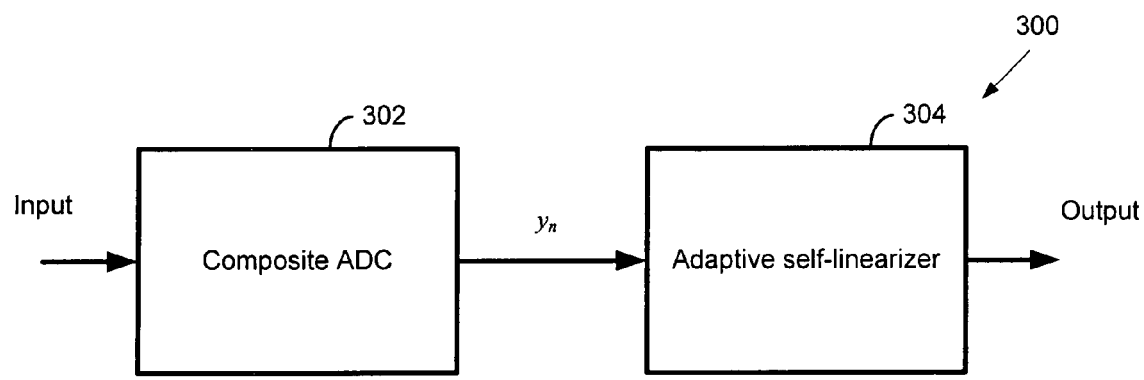
FIG. 3B is a block diagram illustrating an embodiment of an error correcting composite ADC system.

FIG. 3B is a block diagram illustrating an embodiment of an error correcting composite ADC system. In this example, system 300 includes a composite ADC 302, which includes a plurality of ADC components. Each of the ADC components may be a discrete ADC device, an ADC functional block in an integrated circuit, or any other appropriate circuitry for converting an analog signal to digital. In various embodiments, the composite ADC may be an interleaved composite ADC similar to 100 of FIG. 1A, a parallel composite ADC similar to 150 of FIG. 1B, or other types of composite ADC comprising a plurality of ADCs. An analog input signal is received, and a composite signal $y_n$ with distortion is generated by the combining the outputs of the ADC. The distortion is the result of frequency and/or amplitude offset in two or more ADC outputs. The distorted composite signal is sent to an adaptive self-linearizer 304 to be corrected. The adaptive self-linearizer may be implemented as a discrete component, a part of an integrated circuit, or any other appropriate ways.

Figure 4:
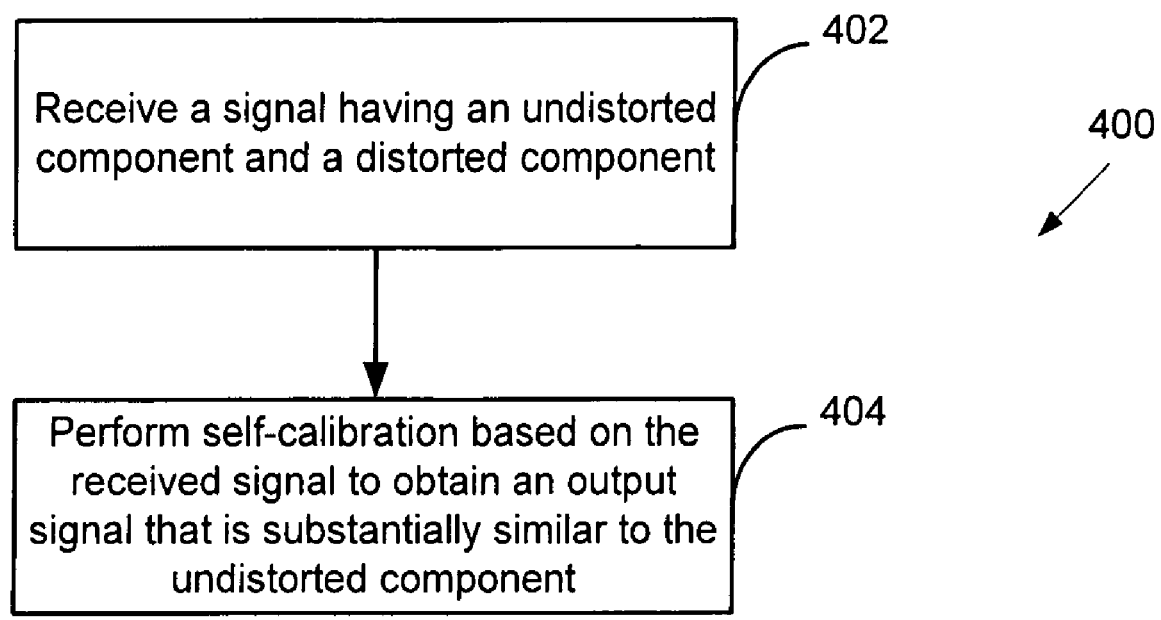
FIG. 4 is a flowchart illustrating an embodiment of a self-linearization process.

FIG. 4 is a flowchart illustrating an embodiment of a self-linearization process. Process 400 may be implemented on adaptive self-linearization modules 354 or 304 of FIGS. 3A and 3B. The process initiates when an unknown signal having an undistorted, ideal component and a distorted component is received (402). The signal is said to be unknown with respect to the receiver of the signal since specific characteristics that define the undistorted component of the signal, such as amplitude, phase, signal frequency, data sequence, or modulation scheme are not necessarily available to the receiver. In other words, the receiver of the signal does not necessarily have direct access to the undistorted component, nor is the receiver necessarily able to reproduce the undistorted component without further linearization.

Self-linearization, sometimes also referred to as blind linearization, is performed based on the received signal to obtain an output signal that is substantially similar to the undistorted component (404). A training signal with known signal characteristics is not required. Thus, the nonlinearities in the system can be corrected while the system is operating in the field. The linearization can be done in real time since it requires no more than a few hundred milliseconds from the time an unknown signal is received. The nonlinear characteristics of the system may change during operation due to nonlinearity causing factors such as variations in the signal source, the paths, the power supply, temperature, signal dynamics, Nyquist zone of the signal, sampling frequency, aging of components, component value tolerances, etc. The adaptive self-linearization module can repeatedly or continuously adapt to correct the nonlinearities despite changes in any of these factors. Further, the operation of the adaptive self-linearization module is independent of the modulation scheme or encoding scheme of the received signal.

Figure 5A:
FIGS. 5A-5C are frequency domain signal spectrum diagrams illustrating an example of nonlinear distortion in a signal.
Figure 5B:
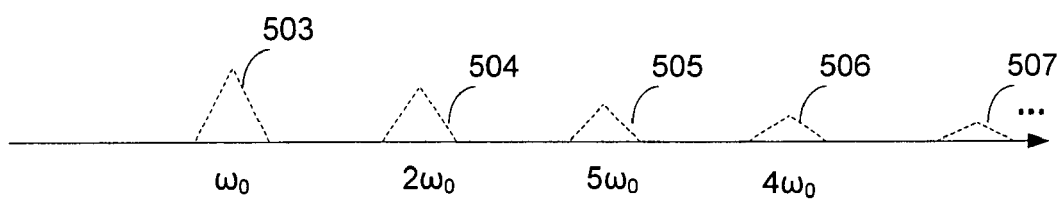
Figure 5C:
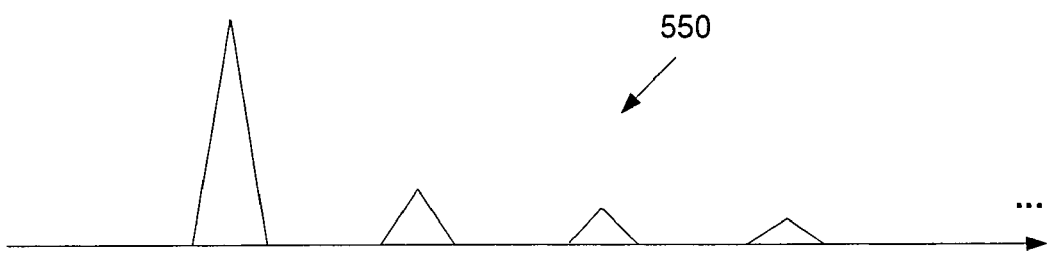

FIGS. 5A-5C are frequency domain signal spectrum diagrams illustrating an example of nonlinear distortion in a signal. In FIG. 5A, signal 500 is an ideal, undistorted signal x centered at $\omega_0$. Nonlinear characteristics of the system lead to distorted components, which are shown in FIG. 5B. The distorted components occur at integer multiples of center frequency $\omega_0$. The resulting signal to be received and processed by the adaptive self-linearization module is shown in FIG. 5C. In the case where a distorted composite signal is generated by a composite ADC, there may also be images caused by the offsets in the ADCs that are aliases of the ideal signal, occurring at mirrored locations relative to half the sampling frequency.

It is assumed that the distortion signal can be expressed using a Taylor series. Even harmonics such as 504 and 506 are caused by distortion terms that are even powers of the signal ($x^2$, $x^4$, etc.). The even harmonics are relatively easy to remove since they are outside the fundamental frequency band of the desired signal. Odd harmonics such as 503, 505, and 507 are caused by distortion terms that are odd powers of the signal ($x^3$, $x^5$, etc.). It is more difficult to remove the odd harmonics since harmonic 503 lies within the fundamental frequency band of the desired signal. As will be shown in more detail below, the adaptive self-linearization module is able to approximately produce the distorted components, thereby approximately determine the ideal, undistorted signal 500. Adaptive self-linearization can be performed based on an unknown signal received while the device is operating (as opposed to using a known training signal). Further, an adaptive self-linearization module allows the device to be calibrated regardless of variations in the nonlinearity causing factors.

Figure 6A:
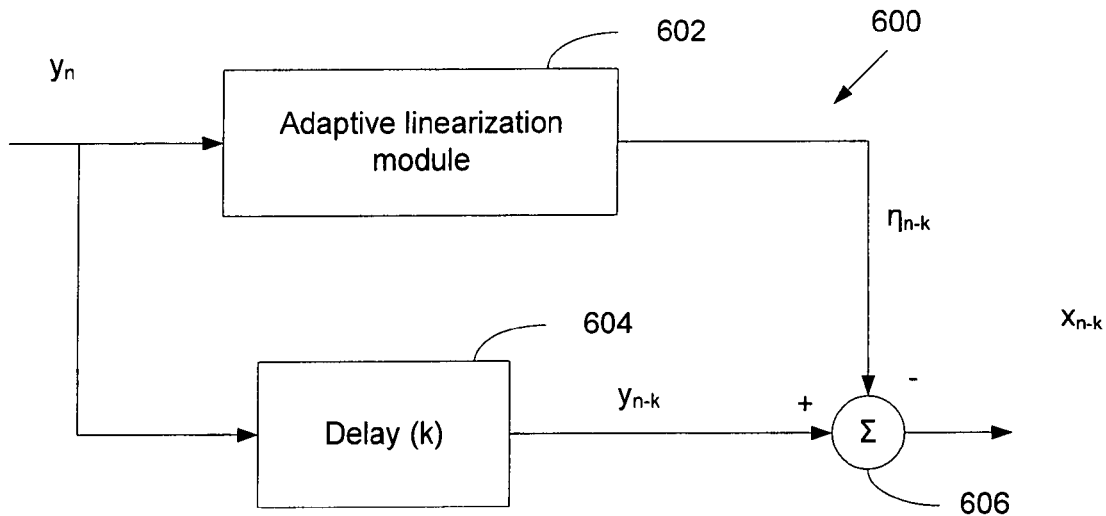
FIG. 6A is a diagram illustrating an embodiment of an adaptive self-linearization module.

FIG. 6A is a diagram illustrating an embodiment of an adaptive self-linearization module. In the example shown, module 600 includes an adaptive linearization module 602 and a delay component 604. Based on its input $y_n$, the adaptive linearization module configures its internal filters to generate an output that approximates the distorted component. Since the adaptation process leads to a delay of k samples in the output, the output is denoted as $\eta_{n-k}$. Details of how the adaptation is made are described below. $y_n$ is sent to a delay module to obtain a delayed version, $y_{n-k}$. Combiner 606 combines $\eta_{n-k}$ from $y_{n-k}$ to obtain the desired, linearized signal component $x_n$. As used herein, combining may be addition or subtraction.

Figure 7A:
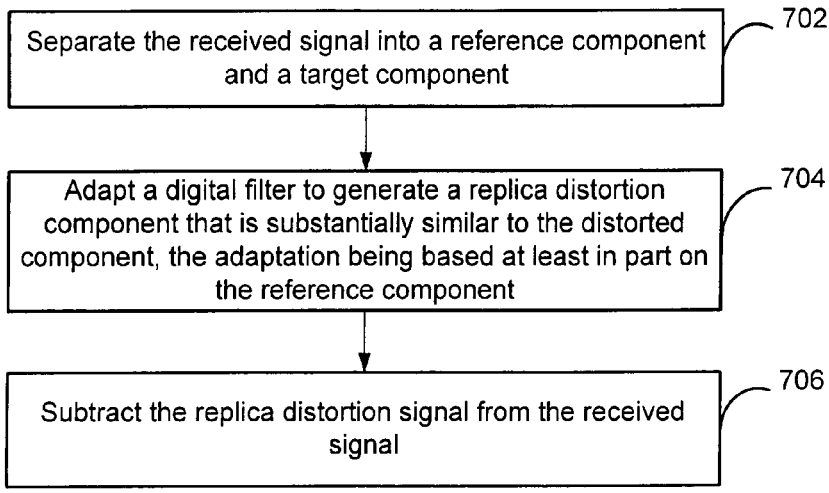
FIG. 7A is a flowchart depicting an embodiment of an adaptive self-linearization process.

FIG. 7A is a flowchart depicting an embodiment of an adaptive self-linearization process. Process 700 shown in the example may be implemented on an adaptive self-linearization module such as 600. During the process, an unknown distorted signal is separated into a reference component and a target component (702). The reference component, sometimes referred to as the offending signal, includes an estimate of one or more signal components that cause the nonlinear distortion in the unknown distorted signal. In some embodiments, the reference component includes an aggregated version of the undistorted component as well as the harmonics within the frequency band of the undistorted component. The harmonics are relatively small and their effects can be ignored for practical purposes. In some embodiments, the reference component includes one or more noise signals in a frequency band separate from that of the desired signal. The target component is the difference between the input signal and the reference component. A digital filter is adapted to generate a replica distortion signal that is substantially similar to the distorted component. The adaptation is based at least in part on the reference component and the target component (704). By separating the reference and target components, the system can train its filter based on a received signal whose characteristics are not known prior to the training. The replica distortion signal is subtracted from the unknown distorted signal to generate the distortion corrected output (706).

Figure 8:
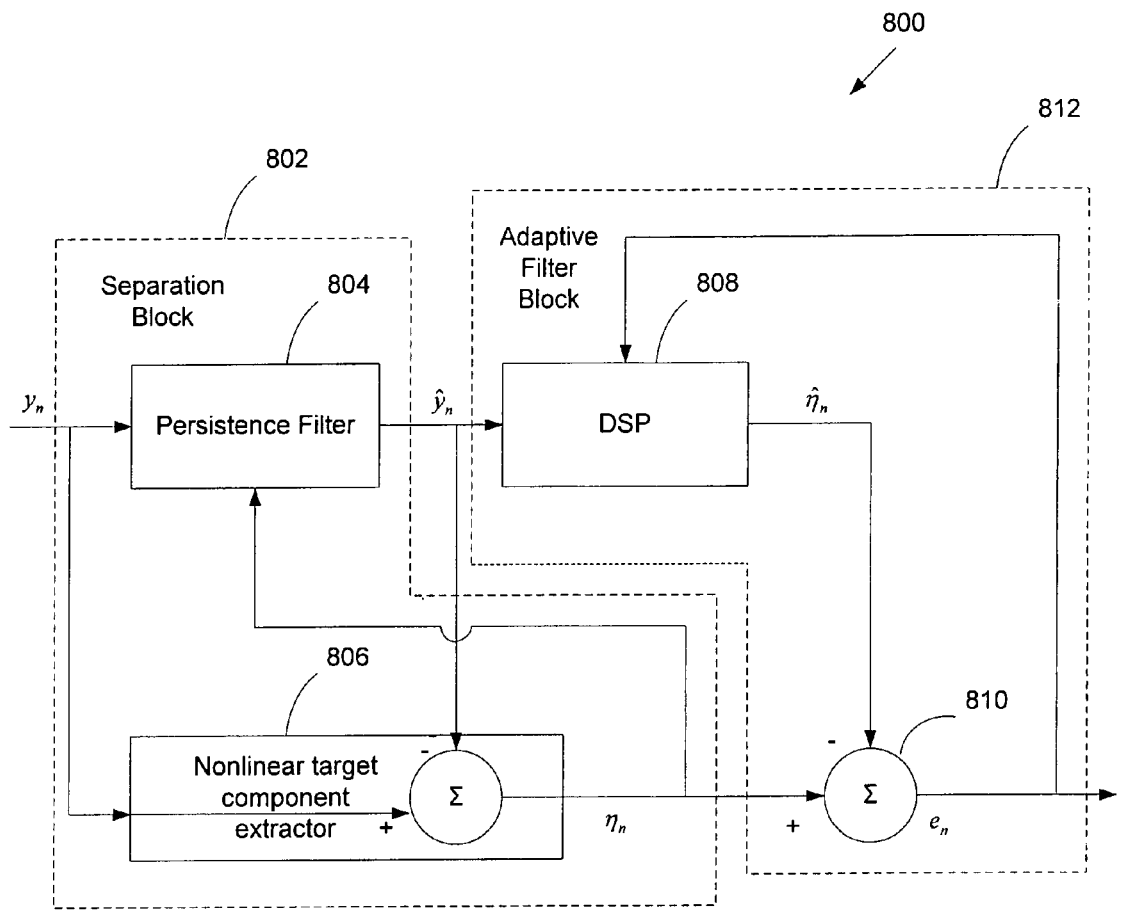
FIG. 8 is a diagram illustrating an embodiment of an adaptive linearization module in detail.

FIG. 8 is a diagram illustrating an embodiment of an adaptive linearization module in detail. In the example shown, system 800 includes a separation block 802 and an adaptive filter block 812. $y_n$ is a received signal with distortion. The signal is sent to separation block 802, which includes a persistence filter 804 and a nonlinear signal extractor 806. In some embodiments, the nonlinear signal extractor includes a delay that corresponds to the delay of persistence filter 804. As will be shown in more detail below, the separation block is configured to extract from the input signal $y_n$ a reference component $\hat{y}_n$. In this example, $\hat{y}_n$ is a linearly enhanced version of the input signal. The target component $\eta$ is a function of the received signal and its history. At each time instance, $\eta_n$ is expressed as $y_n - \hat{y}_n$.

For example, let the received signal $y_n = 1.001 x_n + 0.01 x_n^3$, where $x_n$ is the desired undistorted component, and $0.001 x_n + 0.01 x_n^3$ is the distorted component. A properly configured separation filter will produce a reference component $\hat{y}_n$ that is approximately $k x_n$, (k being a value close to 1), and a target component $\eta_n$ that is $y_n - k x_n$.

In some embodiments, the nonlinear signal extractor further includes a delay element to give the input the same amount of delay as the separation filter. In some embodiments, the nonlinear signal extractor optionally includes a band pass filter, a low pass filter, or a high pass filter. The additional filter is appropriate, for example, in applications where the frequency band of the reference component is known.

Returning to FIG. 8, $\hat{y}_n$ and $\eta_n$ are both sent to an adaptive filter block 812, which includes an adaptive nonlinear digital signal processor (DSP) 808. The adaptive nonlinear DSP is sometimes implemented using an adaptive nonlinear filter. DSP 808 may be implemented using any suitable techniques, such as techniques described in U.S. Pat. No. 6,856,191 by Batruni entitled "NONLINEAR FILTER" and U.S. Pat. No. 6,999,510 by Batruni entitled "NONLINEAR INVERSION", both of which are herein incorporated by reference for all purposes. The patents incorporated by reference describe techniques for building nonlinear filters using linear elements, and for adapting such nonlinear filters to achieve desired transfer characteristics.

The DSP's inputs include the reference component $\hat{y}_n$ and a feedback error signal $e_n$ that is the difference between the target component $\eta_n$ and the DSP's output $\hat{\eta}_n$. The DSP is configured to use $\hat{y}_n$ as its input and $\eta_n$ as its training signal to adapt its filter coefficients and drive the error signal to a predetermined level. The filter coefficients of the DSP's digital filters may be adapted using adaptive techniques including Least Mean Squares (LMS), Recursive Least Squares (RLS), or any other suitable adaptive techniques. The DSP adapts to implement a filter having a transfer function that is approximately the same as the nonlinear transfer function of the system, so that eventually the DSP's output $\hat{\eta}_n$ is about the same as $\eta_n$. In other words, the DSP's adapted transfer function approximately corresponds to the transfer function representing the relationship of the distorted component with respect to the undistorted component. Assuming that the distorted component at the fundamental frequency is relatively small (e.g., $0.001 x_n$ as in the example discussed above), its effect is negligible and therefore is for all practical purposes ignored. In the above example, DSP 808 will adapt its filter parameters such that a transfer function of approximately $0.01 x_n^3$ is obtained.

In the embodiment shown, the error signal of the DSP is expressed as:

$$e_n = \eta_n - W_n^T \hat{Y}_n \qquad (1)$$

where $W_n^T = [w_n w_{n-1} \ldots w_{n-N+1} w_{n-N}]$ are the nonlinear coefficients and $\hat{Y}_n^T = [\hat{y}_n \hat{y}_{n-1} \ldots \hat{y}_{n-N+1} \hat{y}_{n-N}]$ is the nonlinear filter's input vector.

The nonlinear coefficients are expressed using the following general form:

$$w_n = a_n \hat{y}_n + b_n + \sum_{j=1}^{K} c_{j,n} |A_{j,n}^T \hat{Y}_n + \beta_{j,n}| \quad (2)$$

$$= a_n \hat{y}_n + b_n + \sum_{j=1}^{K} c_{j,n} (A_{j,n}^T \hat{Y}_n + \beta_{j,n}) \lambda_{j,n}$$

where $$\lambda_{j,n} = \text{sign}(A_{j,n}^T \hat{Y}_n + \beta_{j,n}) \quad (3)$$

$$\hat{Y}_n = [\hat{y}_{n+M} \; \hat{y}_{n+M-1} \cdots \hat{y}_n \cdots \hat{y}_{n-M+1} \; \hat{y}_{n-M}] \quad (4)$$

$$A_{j,n}^T = [\alpha_{M,n} \; \alpha_{M-1,n} \cdots \alpha_{0,n} \cdots \alpha_{-M+1,n} \; \alpha_{-M,n}] \quad (5)$$

The coefficients have a time index n because the filter is adaptive and therefore time-varying. The nonlinear coefficients are adapted as follows:

$$A_{j,n+1}^T = A_{j,n}^T + \mu c_{j,n} \lambda_{j,n} \hat{Y}_n e_n \hat{y}_n \quad (6)$$

$$\beta_{j,n+1} = \beta_{j,n} + \mu c_{j,n} \lambda_{j,n} e_n \hat{y}_n \quad (7)$$

$$c_{j,n+1} = c_{j,n} + \mu |A_{j,n}^T \hat{Y}_n + \beta_{j,n}| e_n \hat{y}_n \quad (8)$$

$$a_{j,n+1} = a_{j,n} + \mu \hat{y}_n e_n \hat{y}_n \quad (9)$$

$$b_{j,n+1} = b_{j,n} + \mu e_n \hat{y}_n \quad (10)$$

Returning to FIG. 8, separation block 802 employs persistence filter 804 for separating the reference component from the received signal. The persistence filter is designed to boost the linear signal components and attenuate the noise and nonlinear signal components in the received signal. An analogy to the persistence filter is a camera shutter, which allows signals (i.e., light) to pass for a period of time in order to capture the stationary image. The background images that are non-stationary over this period of time become blurry. Like a camera shutter, over a period of time, the persistence filter captures the persistent portion of an input signal and removes the non-persistent portion. The persistence filter operates on pseudo stationary input signals that are not rapidly changing (for example, a signal that is stationary for at least a few milliseconds). For a pseudo stationary input signal, the persistent portion is the average of the desired reference component, which is relatively stable and enhances over time. In some embodiments, the persistence filter is designed as an averaging, linear filter that emphasizes the undistorted signal over noise, and emphasizes linear signal components over nonlinear distortion.

Figure 9:
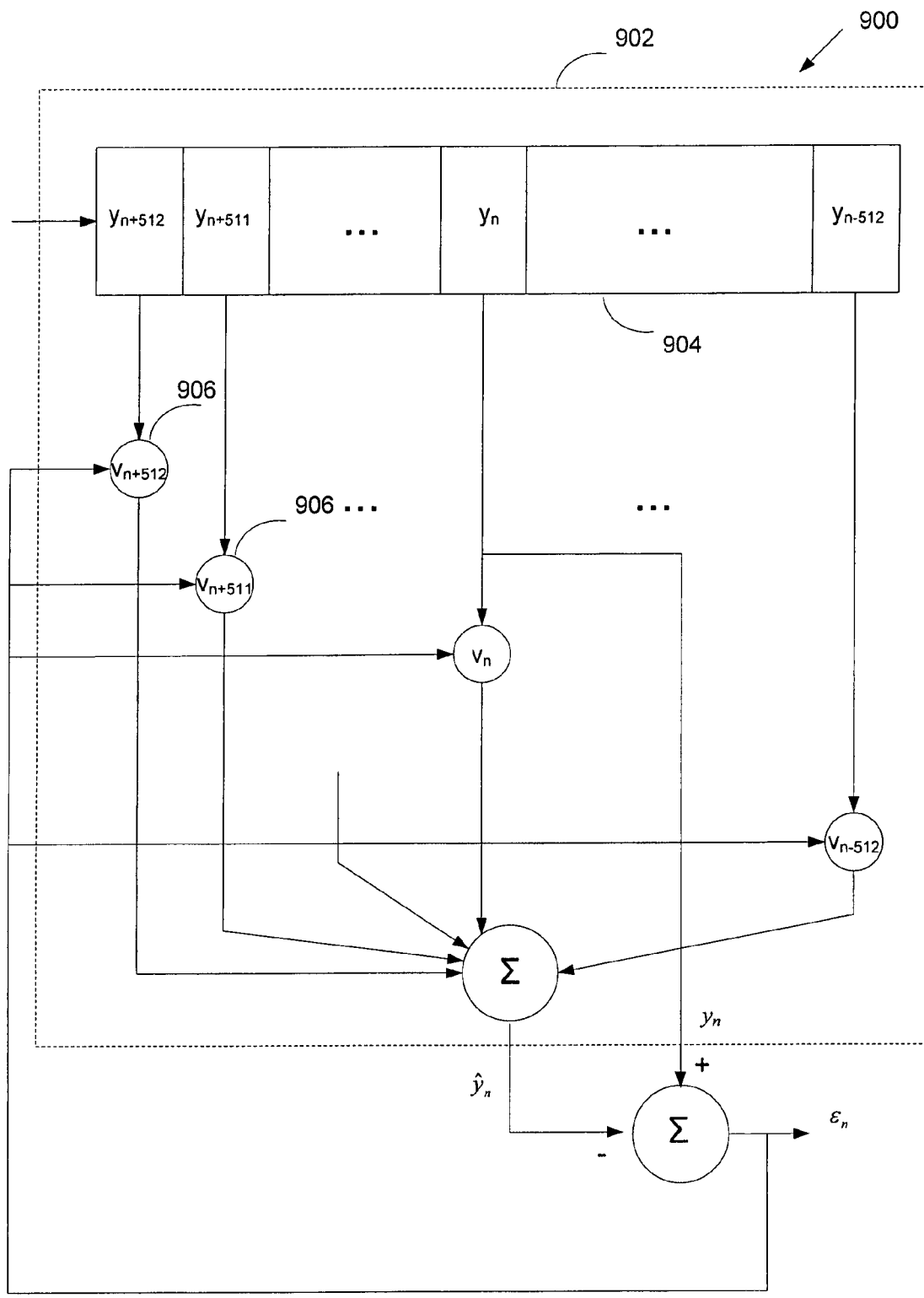
FIG. 9 is a diagram illustrating an embodiment of a separation block.

FIG. 9 is a diagram illustrating an embodiment of a separation block. In this example, separation block 900 includes a persistence filter 902, which includes a delay line 904 to which the input $y_n$ is sent, and a plurality of coefficient multipliers 906. The number of taps in the delay line is represented as $N=2K+1$. In the example shown, K=512, which means that the delay line has 1025 taps for delays of 0, 1, 2, ... 1024. Each $y_i$ (i=n+512, n+511, ..., n, ... n−511, n−512) is scaled by multiplying with an adaptable coefficient $v_i$. The multiplication results are summed, producing the linear reference component $\hat{y}_n$. The center tap value $y_n$ is selected, and $\hat{y}_n$ is subtracted from $y_n$ to produce an error $\epsilon_n$. In this case, $\epsilon_n$ corresponds to target $\eta_n$. The error is fed back to update coefficients $v_i$. An adaptive algorithm such as LMS or RLS is used to update the coefficients until $\epsilon_n$ approaches some predefined threshold value. The separation block is configured to receive the input $y_n$, and aggregate $y_n$ over a period of time to produce an aggregate signal that is substantially similar to the undistorted component. The aggregate signal is considered substantially similar when $\epsilon_n$ meets some predefined threshold value. The aggregate signal is then subtracted from the received input.

Figure 10:
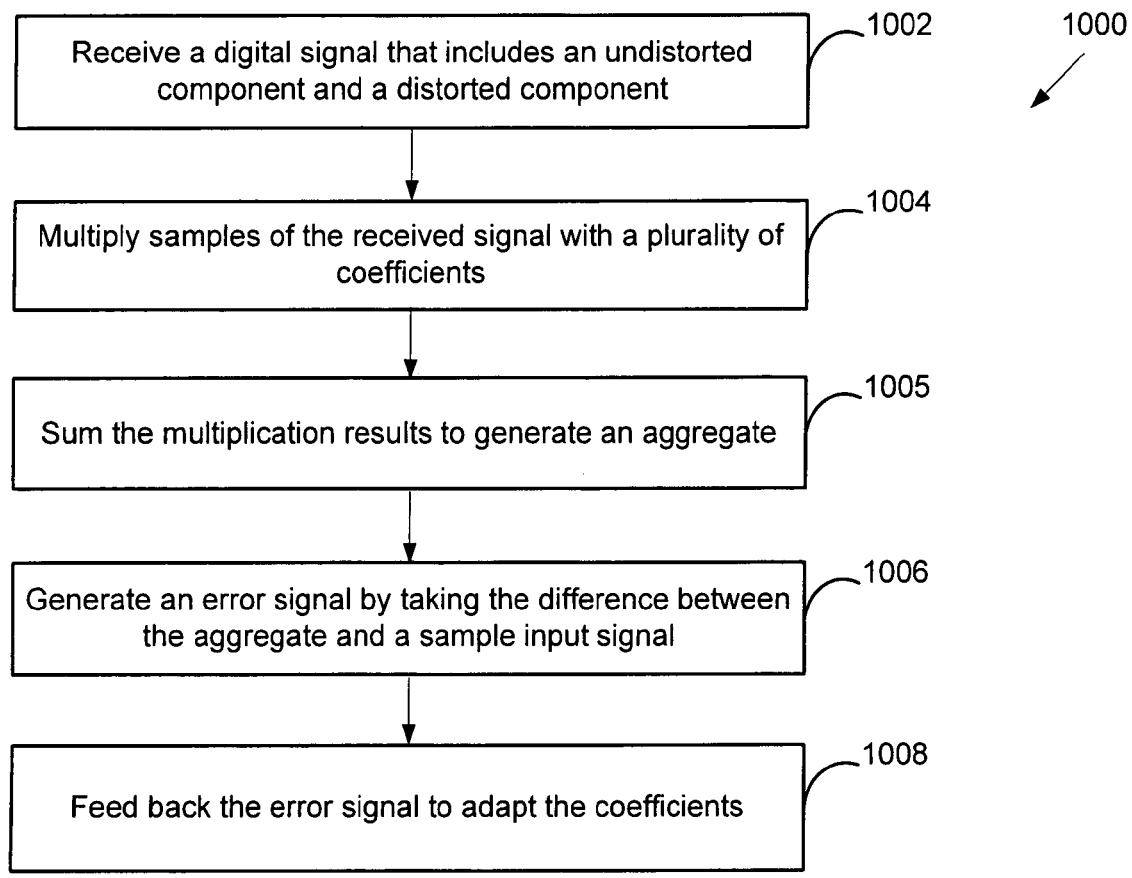
FIG. 10 is a flowchart illustrating an embodiment of a process for extracting an undistorted component from a distorted signal.

FIG. 10 is a flowchart illustrating an embodiment of a process for extracting an undistorted component from a distorted signal. Process 1000 may be implemented on a separation block, such as 900 shown in FIG. 9. In this example, during the process, a digital signal that includes an undistorted component and a distorted component is received (1002). A plurality of samples of the received signal are multiplied with a plurality of coefficients (1004). The multiplication results are summed to produce an aggregate (1005). The aggregate enhances the undistorted component and attenuates the distorted component. An error is generated by taking the difference between the aggregate and a sample of the received signal (1006). The error is fed back to adapt the coefficients (1008).

The persistence filter can be described using the following functions:

$$\eta_n = y_n - V_n Y_n \quad (11)$$

$$\eta_n = y_n - \hat{y}_n \quad (12)$$

$$V_{n+1} = \nu V_n + \mu \eta_n Y_n \quad (13)$$

where $Y_n = [y_{n+K} \; y_{n+K-1} \cdots y_n \cdots y_{n-k-1} y_{n-K}]$, $V_n = [v_{n+K} v_{n+K-1} \cdots v_n \cdots v_{n-K-1} v_{n-K}]$, μ is the adaptation step size that controls the persistency factor of the filter and ν is the forgetting factor that controls the speed with which the filter adapts to changing signal dynamics.

Figure 11:
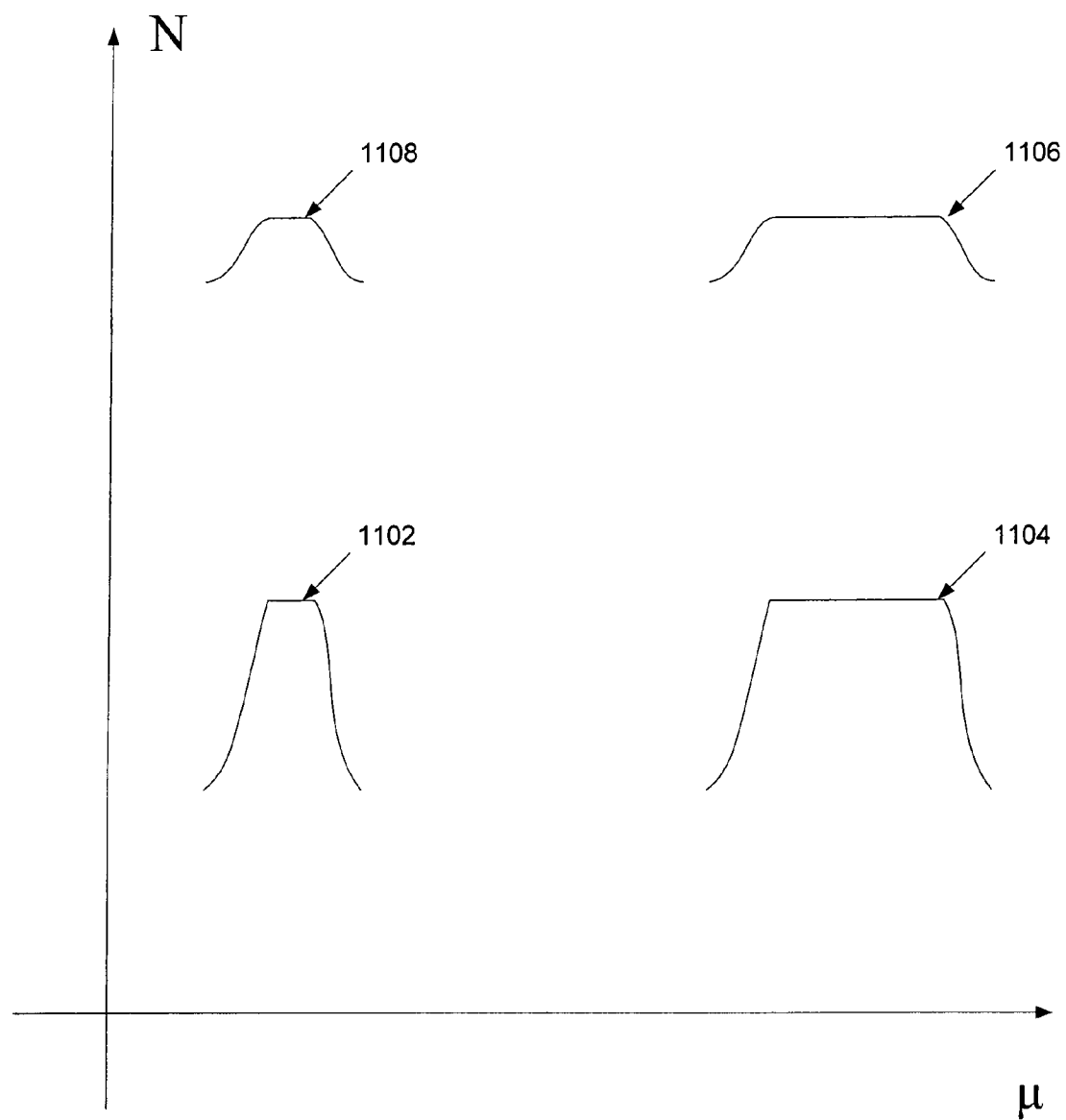
FIG. 11 is a diagram illustrating the relative relationship of step size μ, number of taps N, and the type of linear component that can be effectively extracted.

The number of filter taps N (also referred to as the order of the filter) and the adaptive step size μ control the persistence filter's operations. A given filter order and step size combination may be particularly effective for emphasizing the received signal's linear component within a certain range of bandwidth and amplitude. FIG. 11 is a diagram illustrating the relative relationship of step size μ, number of taps N, and the type of linear component that can be effectively extracted. The diagram informs the choice of μ and N. Generally, a higher N (i.e., a greater number of filter taps) should be used as the amplitude of the linear component goes down, and a smaller μ (i.e., a smaller step size) should be used as the bandwidth of the linear component goes down. As shown in the diagram, if the linear component has a relatively large amplitude and a relatively narrow bandwidth (such as signal 1102), a persistence filter with a small μ and a small N produces good results. A linear component having a similarly large amplitude but a wider bandwidth (signal 1104) requires a relatively small N and allows a greater μ. A small amplitude and large bandwidth linear component (signal 1106) requires a large N and a large μ. A small amplitude and narrow bandwidth linear component (signal 1108) requires a small μ and a large N. During operation, N and μ can be adjusted to more effectively generate the emphasized linear component. For example, in some embodiments, a peak detector and a power level detector are used to detect the strength of the signal. The signal strength is a function of the signal's peak and bandwidth. Based on the detected signal strength, appropriate adjustments to N and μ are made according to system requirements to control the adaptation.

Figure 6B:
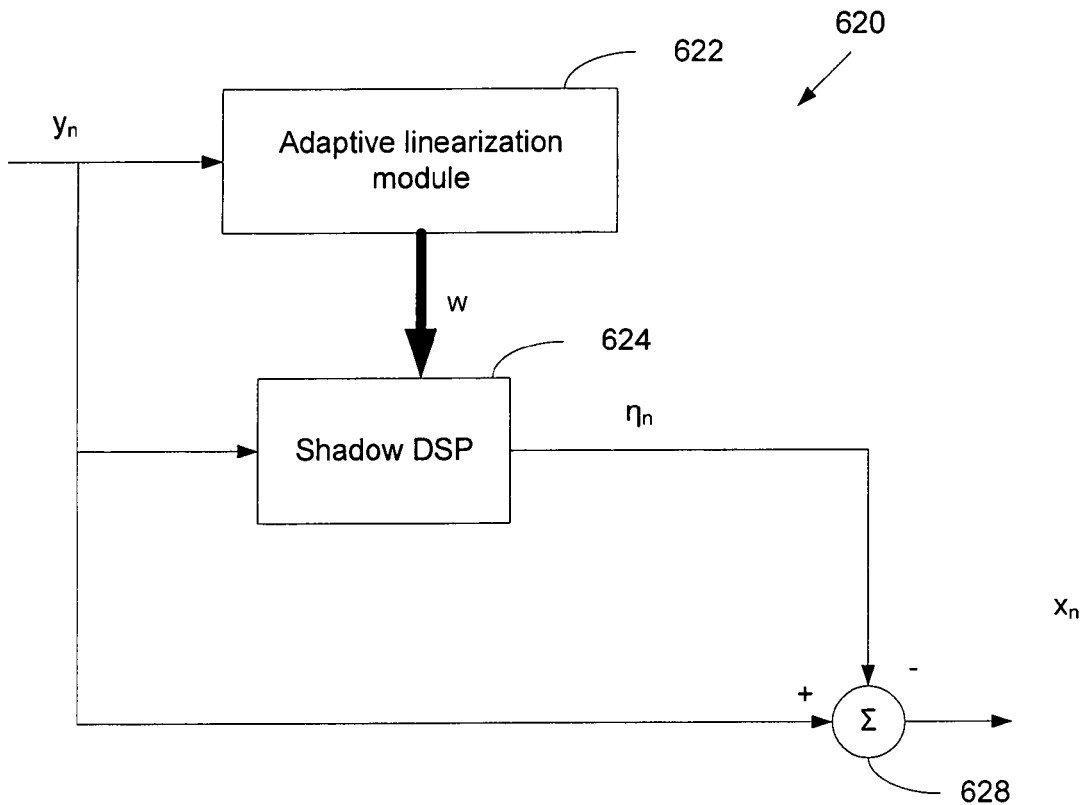
FIG. 6B is a diagram illustrating an embodiment of a low latency adaptive self-linearization system.

In some embodiments, the linearization process requires a large number of samples. The delay k sometimes corresponds to hundreds or even thousands of samples, resulting in delay on the order of tens or even hundreds of milliseconds. Some applications (e.g. telecommunication applications) may require the linearization process to have a lower latency. FIG. 6B is a diagram illustrating an embodiment of a low latency adaptive self-linearization system. In the example shown, system 620 is configured to have much lower latency than system 600. The DSPs shown in the system may be implemented as general or special purpose processors, or configurable filters. Adaptive linearization module 622 configures an internal DSP to simulate the nonlinear transfer function to be corrected and produces an output that is approximately equal to the nonlinear residual signal. As discussed above, assuming that the distortion within the fundamental frequency band is relatively small, a successfully adapted and configured DSP will have a transfer function that is approximately equal to the nonlinear transfer function to be corrected. The linearization module outputs the configuration parameters, w, to a shadow nonlinear DSP 624, which uses the parameters to configure its filters and duplicate the transfer function of the DSP employed by the adaptive linearization module. DSP 624's latency L is on the order of a few milliseconds, which is significantly smaller than the delay due to adaptation k. As such, system 620 has significantly less delay than system 600.

Figure 7B:
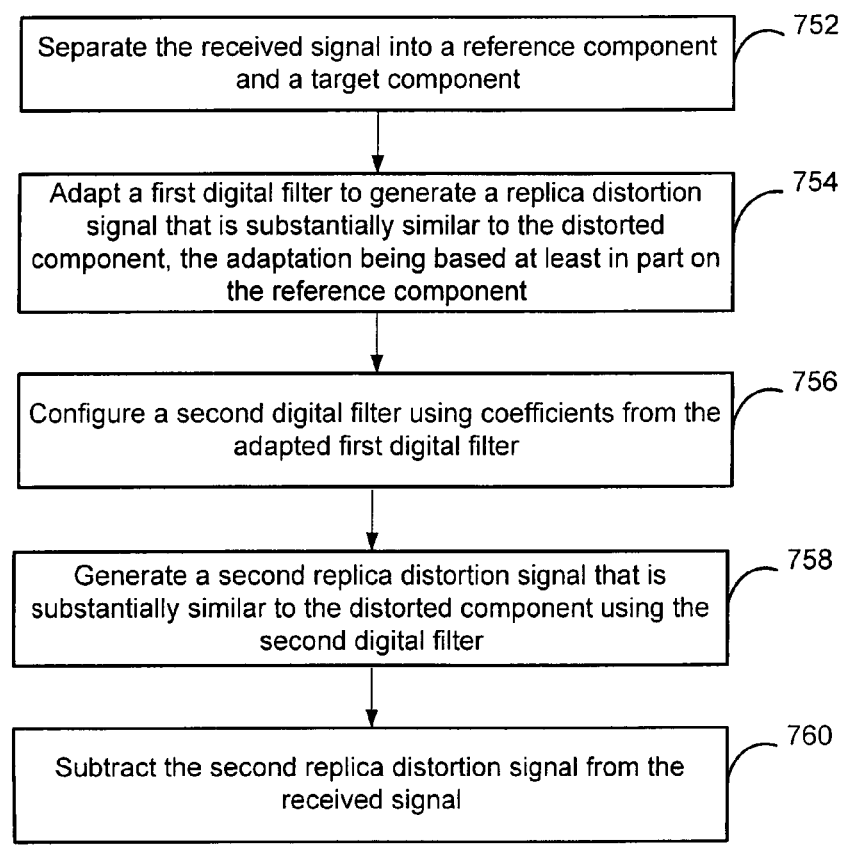
FIG. 7B is a flowchart illustrating another embodiment of an adaptive self-linearization process.

FIG. 7B is a flowchart illustrating another embodiment of an adaptive self-linearization process. Process 750 shown in the example may be implemented on a low latency adaptive self-linearization module such as 620. During the process, an unknown distorted signal is separated into a reference signal and a target signal (752). A first digital filter is adapted to generate a replica distortion signal that is substantially similar to the distorted component, where the adaptation is based at least in part on the reference signal (754). A second digital filter is configured using coefficients from the adapted first digital filter (756). A second replica distortion signal that is substantially similar to the distorted component using the second digital filter (758).

Figure 12A:
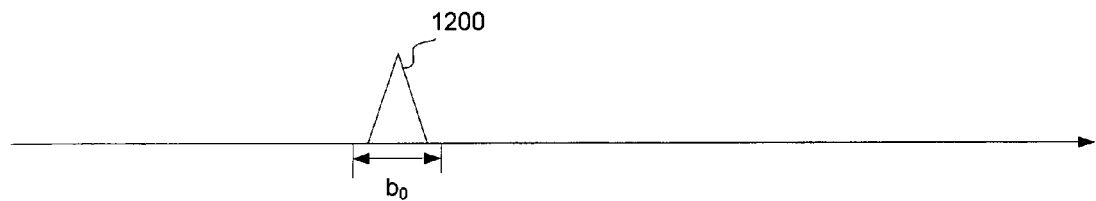
FIGS. 12A-12C are frequency domain signal diagrams illustrating an example of a signal whose reference and target components occupy different frequency bands.
Figure 12B:
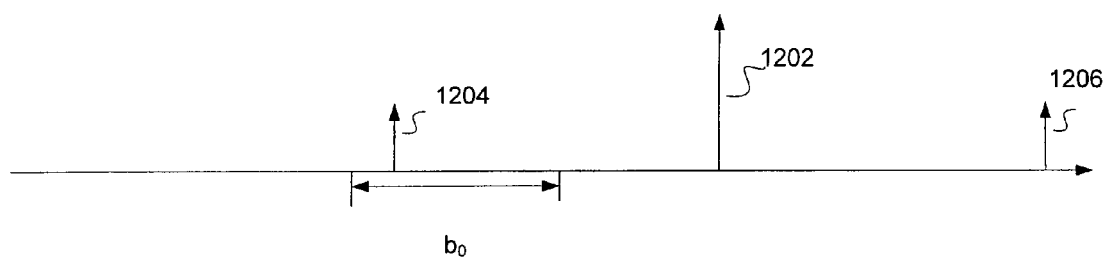
Figure 12C:
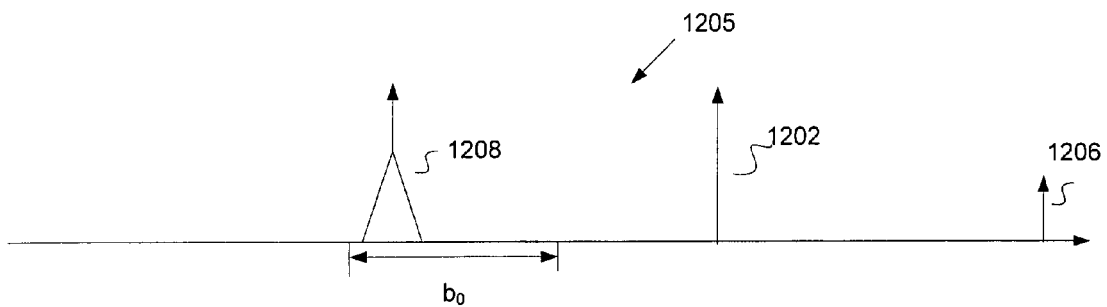

In some embodiments, the reference component and the target component occupy separate frequency bands. FIGS. 12A-12C are frequency domain signal diagrams illustrating an example of a signal whose reference and target components occupy different frequency bands. FIG. 12A shows the ideal, undistorted component 1200, which is limited to frequency band $b_0$. An example of the ideal signal is a radio frequency (RF) signal used in a wireless communication system that employs some form of frequency division, where the signal occupies a specific frequency channel $b_0$. FIG. 12B shows the distortion component, which includes noise signal component 1202 that is outside $b_0$, as well as harmonics of the noise component, including 1204 which falls within frequency channel $b_0$, and 1206 which lies outside $b_0$. An example of noise signal 1202 is another RF signal occupying an adjacent frequency channel relative to signal 1200 and causing distortion in frequency channel $b_0$. FIG. 12C shows the resulting signal 1205. Although the general frequency ranges of the reference and target components are known, the specific characteristics of the signal components are still unknown. Thus, the signal is suitable for processing by any adaptive self-linearization module that implements processes 400 or 700.

Figure 13:
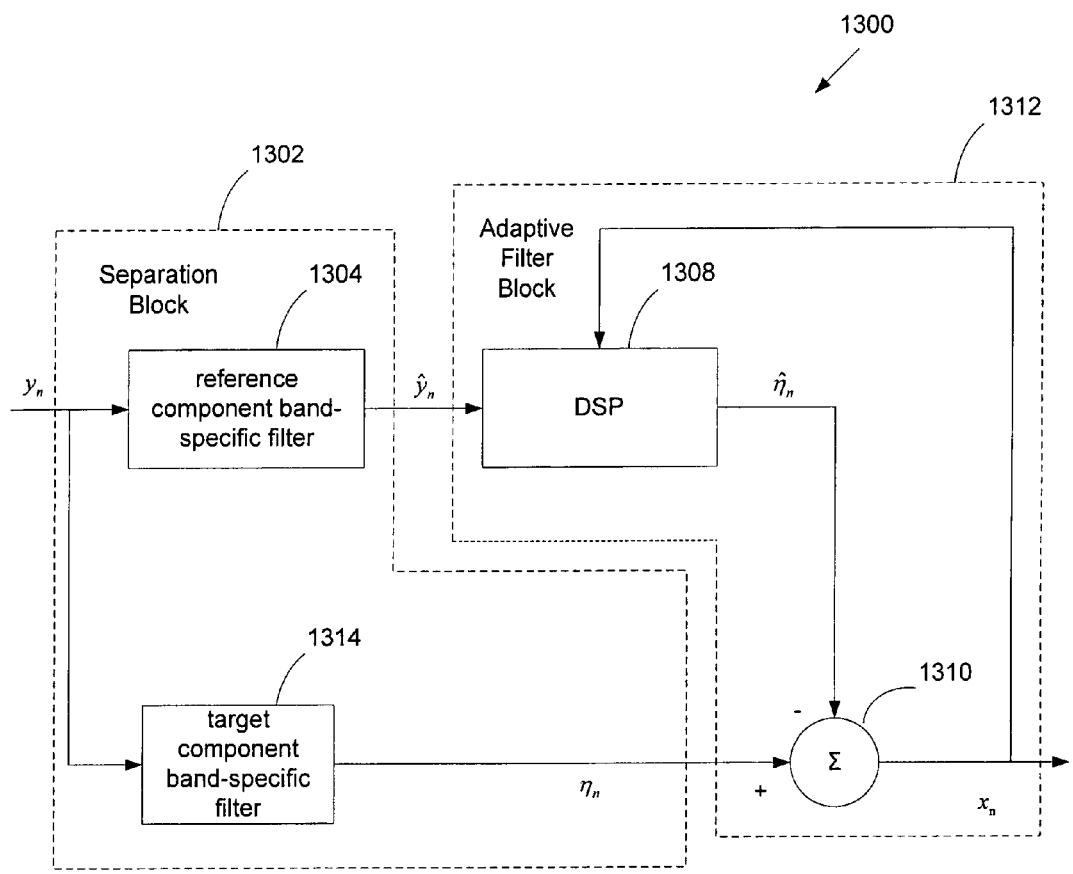
FIG. 13 is a block diagram illustrating another embodiment of an adaptive self-linearization module.

An adaptive self-linearization module such as 600 or 620 described above can be used to process the type of signal shown in FIG. 12C. Assuming that the desired signal causes little distortion in its own frequency band and that most of the distortion in the received signal is caused by noise from neighboring frequency channel(s), it is possible to employ adaptive self-linearization modules with less complex circuitry by taking advantage of the fact that the reference and target components reside in different frequency bands. FIG. 13 is a block diagram illustrating another embodiment of an adaptive self-linearization module. In the example shown, separation block 1302 includes a reference signal band-specific filter 1304 and a target signal band-specific filter 1314. In some embodiments, the reference band-specific filter includes a band-stop filter configured to extract from the received signal the noise component and its harmonics outside frequency band $b_0$ and suppress the components within $b_0$, generating the reference component $\hat{y}_n$. The target signal band-specific filter includes a band-pass filter configured to pass components in frequency band $b_0$ and attenuate the rest of the frequencies, generating the target component $\eta_n$.

Based on reference component $\hat{y}_n$, DSP adapts its parameters to generate a replica of the distorted signal, $\hat{\eta}_n$. The adaptation is possible because the reference component and the distorted signal are correlated. $\hat{\eta}_n$ is subtracted from the target component $\eta_n$ to obtain the desired signal $x_n$. A suitable adaptation technique such as LMS or RLS is used to adapt the DSP. Some embodiments base the adaptation on equations (1)-(10).

Referring to FIGS. 12A-12C as an example, the input signal $y_n$ corresponds to signal 1205. The separation block extracts reference component $\hat{y}_n$ which corresponds to components 1202 plus 1206 and target component $\eta_n$ which corresponds to component 1208. In some embodiments, the separation block further limits the bandwidth of reference component extraction such that only 1202 is extracted. Based on $\hat{y}_n$, and its feedback signal $x_n$, the adaptive DSP adapts its transfer function to generate $\hat{\eta}_n$, which approximately corresponds to signal 1204.

In some embodiments, the offending signals causing distortion in the fundamental frequency band of the desired signal may reside in multiple frequency bands. FIGS. 12A-12C are frequency domain signal diagrams illustrating an example where both the reference component and the target component occupy multiple frequency bands. FIG. 12A shows the undistorted signal components 1200-1204, which occupy separate frequency bands $b_1$-$b_3$. FIG. 12B shows the distorted signal components, which includes several noise components 1210-1214 which reside outside $b_1$-$b_3$, and their harmonics 1216, 1218, and 1220 which reside within $b_1$, $b_2$, and $b_3$ respectively. FIG. 12C shows the resulting distorted signal 1230.

FIG. 13 is a block diagram illustrating an embodiment of an adaptive self-linearization system configured to correct a distorted signal (such as 1230 of FIG. 12C) whose reference components and target components occupy multiple separate frequency bands. In the example shown, system 1300 includes a reference component band-specific filter 1304 for selecting reference signal components $\hat{y}_n$ that cause distortion (e.g., signal components 1210-1214 shown in FIG. 12B). Filter 1304 may be implemented using a plurality of bandpass filters. The system also includes N target component band-specific filters for producing target components $\eta k_n$ (k=1, ..., N) in specific frequency bands. In the example shown in FIG. 12C, N=3, and target components corresponding to 1232, 1234 and 1236 are produced. N DSPs are each adapted based on the reference component and a corresponding feedback signal $xk_n$ to generate distortion components $\hat{\eta}k_n$ (k=1, ..., N). Each $\hat{\eta}k_n$ is subtracted from the target component $\eta_n$ to obtain the desired signal $x_n$. The adaptation technique of each DSP is similar to what was described in FIG. 13.

Figure 14:
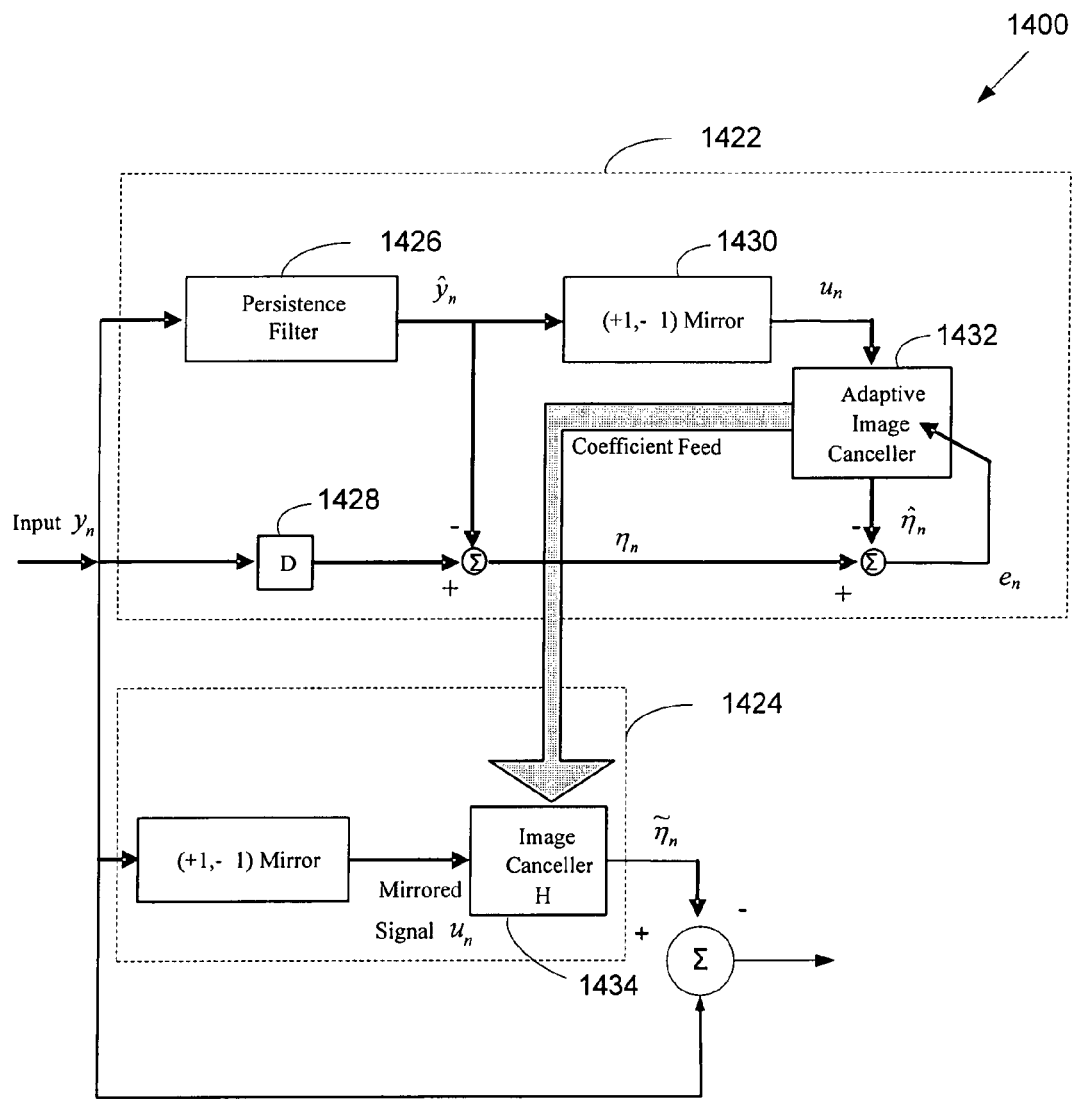
FIG. 14 is a block diagram illustrating an example of an adaptive self-linearizer used to implement a distortion correcting composite ADC embodiment.

FIG. 14 is a block diagram illustrating an example of an adaptive self-linearizer used to implement a distortion correcting composite ADC embodiment. In the example shown, adaptive self-linearizer 1400 has similar functional blocks as low latency system 620 of FIG. 6B. The adaptive self-linearizer may be included in an error correcting composite ADC such as system 300 of FIG. 3B. The adaptive self-linearizer may be implemented as a discrete component, as a part of an integrated circuit, or in any other appropriate ways. The adaptive self-linearizer has an interface configured to receive a composite signal $y_n$ generated by a plurality of ADCs. As will be described in more detail below, the adaptive self-linearizer performs self-linearization based on the composite signal, such that the distortion in the composite signal is corrected and a substantially undistorted output is generated.

Figure 15:
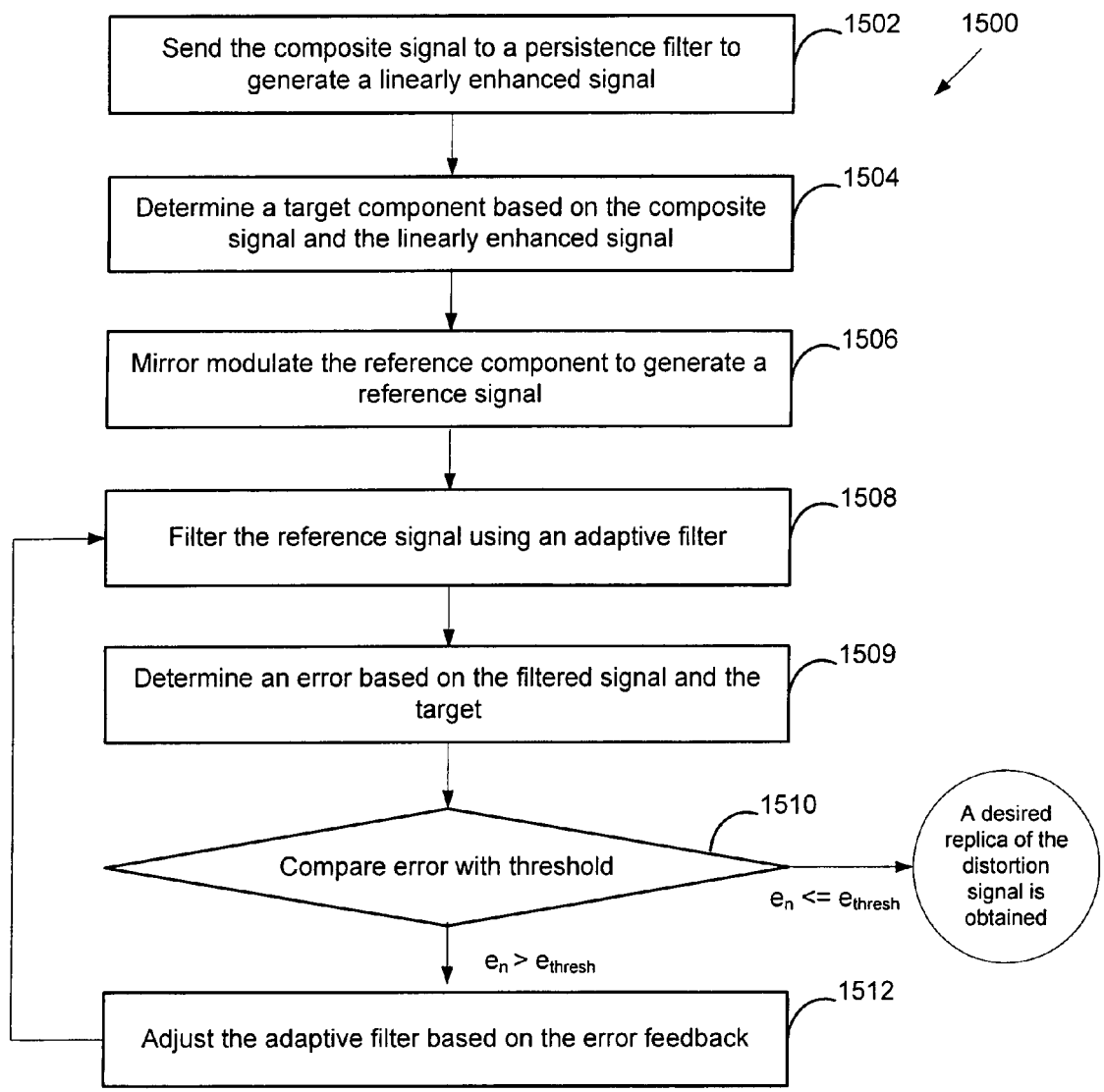
FIG. 15 is a flowchart illustrating an embodiment of a detailed process for separating the received signal and adapting the filter block to generate the replica distortion signal.

In this example, adaptive self-linearizer 1400 includes an adaptive self-linearization module 1422 and a shadow DSP 1424. The adaptive self-linearization module is similar to module 800 of FIG. 8. Adaptive self-linearizer 1400 carries out its operations according to process 750 of FIG. 7B. FIG. 15 is a flowchart illustrating an embodiment of a detailed process for separating the received signal and adapting the filter block to generate the replica distortion signal. Process 1500 may be implemented on adaptive self-linearizer 1400. In this example, to separate the received signal into a reference component and a target component, the distorted composite signal $y_n$ is sent to a persistence filter (1502). Referring to FIG. 14, a filter similar to 900 of FIG. 9 is used to implement persistence 1426, which produces a linearly enhanced signal $\hat{y}_n$ according to a process similar to 1000 described above. The persistence filter is characterized using equations (11)-(13) described above. The resulting signal $\hat{y}_n$ is a linearly enhanced version of the input signal $y_n$. In other words, $\hat{y}_n$ is approximately equal to the desired undistorted component since the aliased image is nearly removed by the persistence filter. The delay block selects the center tap, $y_n$. To determine the desired undistorted component more precisely, the difference between $\hat{y}_n$ and $y_n$ is computed to derive a target $\eta_n$ (1504).

To determine the reference signal, the linearly enhanced component $\hat{y}_n$ is mirror-modulated to generate a mirror-modulated signal $u_n$ (1506). Referring to FIG. 14, mirror-modulation is accomplished by sending $\hat{y}_n$ to mirror-modulator 1430 to be modulated (multiplied) with a mirroring sequence of [c, −c, c, −c, ...], where c is a constant and chosen as 1 in some embodiments for the sake of convenience. Here, the mirror-modulated signal is treated as the offending signal causing the aliased images. In other words, the mirror-modulated signal $u_n$ is the reference signal. The reference signal has the same spectral frequency properties as the aliased images but a different amplitude.

The reference signal is filtered by an adaptive filter to generate a filtered signal $\hat{\eta}_n$ (1508). In FIG. 14, the adaptive filter corresponds to adaptive image canceller 1432, which use $u_n$ as its input and $\eta_n$ as its training signal to adapt its filter coefficients to drive the error signal to a predetermined level, thereby producing an output that is approximately equal to the target. The filter is referred to as an adaptive image canceller since it is used to help generate the aliased image to be cancelled from the input signal. As discussed previously, the filter coefficients may be adapted using adaptive techniques including Least Mean Squares (LMS), Recursive Least Squares (RLS), or any other suitable adaptive techniques. The filter adapts to achieve a transfer function that is approximately the same as the nonlinear transfer function of the system, such that eventually the filter's output $\hat{\eta}_n$ is about the same as $\eta_n$.

An error is computed based on the difference between $\eta_n$ and $\hat{\eta}_n$ (1509). The error signal of the adaptive image canceller filter 1432 is expressed according to equation (1) above. The error e is compared with a predefined threshold level $e_{thresh}$ (1510). If the error is greater than the predefined threshold, it is fed back to the adaptive filter to adjust the adaptive filter's coefficients (1512). The coefficients of the adaptive filter may be linear or nonlinear. In some embodiments, a nonlinear form of the coefficients is described according to equations (2)-(5), and is adapted according to equations (6)-(10) to minimize the error $e_n$.

The reference signal is filtered by the adaptive filter with new coefficients (1508). 1508-1512 repeat until the error falls below the threshold and an acceptable replica of the distortion signal, $\hat{\eta}_n$, is obtained. The shadow DSP is configured using the coefficients from the adaptive filter. In the case of system 1400, image canceller 1424 is configured using the coefficients from adaptive image canceller 1432, and a second replica distortion signal $(\tilde{y}_n)$ that is substantially similar to the distorted component is generated. The second replica distortion signal is subtracted from the composite signal received to generate a substantially undistorted output.

The above example illustrates using an adaptive linearizer to reduce distortion in a signal generated by a composite ADC. The example employs a shadow DSP 1424 to reduce latency. In applications where latency consideration is less important, adaptive self-linearization module 1422 may be included in an adaptive self-linearizer similar to 600 of FIG. 6A, which does not include a shadow filter but can still achieve distortion reduction.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A distortion correcting analog to digital converter (ADC) system, comprising:
    a plurality of ADCs configured to convert an analog signal to a plurality of digital ADC outputs, wherein:
        the plurality of ADCs are configured to generate a composite signal based on the plurality of ADC outputs;
        there is an offset between a first one of the plurality of ADC outputs and a second one of the plurality of ADC outputs, the offset causing distortion in the composite signal; and
    an adaptive self-linearizer configured to receive the composite signal, and to perform self-linearization based on the composite signal to correct for the distortion in the composite signal, wherein
    performing self-linearization includes:
        adaptively generating a replica distortion signal that is substantially similar to the distorted component; and
        subtracting the replica distortion signal from the composite signal to obtain an output signal.

2. The system of claim 1, wherein the offset includes a phase offset.

3. The system of claim 1, wherein the offset includes an amplitude offset.

4. The system of claim 1, wherein the adaptive self-linearizer includes a persistence filter configured to generate a linearly enhanced signal based on the composite signal.

5. The system of claim 4, wherein the adaptive self-linearizer includes a subtractor configured to subtract the linearly enhanced signal from the composite signal to generate a target signal.

6. The system of claim 4, wherein the adaptive self-linearizer includes a mirror modulator configured to modulate the enhanced signal with a mirroring sequence.

7. The system of claim 6, wherein the mirror modulator generates a reference signal, and the adaptive self-linearizer further includes an adaptive filter configured to filter the reference signal.

8. The system of claim 7, wherein the adaptive filter is configured to adapt a filter coefficient.

9. The system of claim 8, wherein the filter coefficient is duplicated on a second filter.

10. The system of claim 8, wherein the adaptive filter is configured to adapt the filter coefficient, based at least in part on a difference between the target signal and the filtered signal.

11. A method of generating a distortion corrected digital signal, comprising:
converting an analog signal to a plurality of digital signals;
generating a composite signal based on the plurality of digital signals; wherein there is an offset between a first one of the plurality of ADC outputs and a second one of the plurality of ADC outputs, the offset causing distortion in the composite signal;
sending the composite signal to an adaptive self-linearizer; and
performing self-linearization based on the composite signal to correct for distortion in the composite signal, including:
adaptively generating a replica distortion signal that is substantially similar to the distorted component; and
subtracting the replica distortion signal from the composite signal to obtain an output signal.

12. The method of claim 11, wherein performing self-linearization includes generating a linearly enhanced signal based on the composite signal.

13. The method of claim 12, wherein performing self-linearization includes subtracting the linearly enhanced signal from the composite signal to generate a target signal.

14. The method of claim 12, wherein performing self-linearization includes modulating the enhanced signal with a mirroring sequence.

15. The method of claim 14, wherein modulating the enhanced signal with a mirroring sequence generates a reference signal, and wherein performing self-linearization further includes filtering the reference signal using an adaptive filter to generate a filtered signal.

16. The method of claim 15, wherein performing self-linearization includes adapting a filter coefficient of the adaptive filter.

17. The method of claim 16, further comprising duplicating the filter coefficient on a second filter.

18. The method of claim 16, wherein the adaptive filter is configured to adapt the filter coefficient, based at least in part on a difference between the target signal and the filtered signal.

19. An adaptive self-linearizer, comprising:
an interface configured to receive a composite signal that is a combination of a plurality of analog to digital converter (ADC) outputs, wherein there is an offset between a first one of the plurality of ADC outputs and a second one of the plurality of ADC outputs, the offset causing distortion in the composite signal; and
an adaptive self-linearization module configured to receive the composite signal, and to perform self-linearization based on the composite signal to correct for the distortion in the composite signal; wherein
performing self-linearization includes:
adaptively generating a replica distortion signal that is substantially similar to the distorted component; and
subtracting the replica distortion signal from the composite signal to obtain an output signal.

20. A method of generating a distortion corrected digital signal, comprising:
receiving a composite signal that is a combination of a plurality of analog to digital converter (ADC) outputs, wherein there is an offset between a first one of the plurality of ADC outputs and a second one of the plurality of ADC outputs, the offset causing distortion in the composite signal; and
performing self-linearization based on the composite signal to correct for the distortion in the composite signal; wherein
performing self-linearization includes:
adaptively generating a replica distortion signal that is substantially similar to the distorted component; and
subtracting the replica distortion signal from the composite signal to obtain an output signal.

* * * * *